United States Patent
Mets

(10) Patent No.: US 11,101,105 B1
(45) Date of Patent: Aug. 24, 2021

(54) NOISE REDUCTION OF A HIGH VOLTAGE SUPPLY VOLTAGE

(71) Applicant: Applied Materials Israel Ltd., Rehovot (IL)

(72) Inventor: Denys Mets, Petah Tiqwa (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/885,740

(22) Filed: May 28, 2020

(51) Int. Cl.
*H01J 37/28* (2006.01)
*H01J 37/244* (2006.01)
*G01N 23/2251* (2018.01)
*H01J 37/248* (2006.01)
*H01J 37/24* (2006.01)

(52) U.S. Cl.
CPC .......... *H01J 37/28* (2013.01); *G01N 23/2251* (2013.01); *H01J 37/241* (2013.01); *H01J 37/244* (2013.01); *H01J 37/248* (2013.01)

(58) Field of Classification Search
CPC ........ H01J 37/28; H01J 37/244; H01J 37/248; H01J 37/241; G01N 23/2251
USPC .................................................. 250/306, 307
See application file for complete search history.

(56) References Cited

U.S. PATENT DOCUMENTS

| 4,261,014 | A | * | 4/1981 | Lee | H04N 5/21 348/626 |
|---|---|---|---|---|---|
| 7,339,175 | B1 | * | 3/2008 | Drummond | G01T 1/2928 250/370.01 |
| 2005/0184252 | A1 | * | 8/2005 | Ogawa | H01J 37/222 250/492.3 |
| 2006/0145076 | A1 | * | 7/2006 | Yamaguchi | G01N 23/2251 250/310 |
| 2021/0072048 | A1 | * | 3/2021 | Sobukawa | G01B 7/00 |

* cited by examiner

*Primary Examiner* — David A Vanore
(74) *Attorney, Agent, or Firm* — Kilpatrick Townsend & Stockton LLP

(57) ABSTRACT

A method, and a high voltage (HV) system that may include a noise reduction unit (MNRU) and a bias setting unit (BSU). The HV system may receive a HV supply signal, over a high voltage supply line from a HV supply unit. The HV supply unit, the MNRU, the BSU and a HV charged particle system may share a ground. At least the MNRU may detect noise in the HV supply signal and send, though the ground, a noise compensation signal. The BSU may receive an indication about a requested value of a bias voltage, and apply the bias voltage to a noise compensated HV signal to provide a biased and noise compensated HV signal to the HV charged particle system.

16 Claims, 4 Drawing Sheets

NOISE REDUCTION OF A HIGH VOLTAGE SUPPLY VOLTAGE

BACKGROUND

A Scanning Electron Microscope (SEM) is a fab tool which produces images of a sample such as a wafer by illuminating the wafer with a focused electron beam (e-beam) and detecting secondary electrons from the wafer. The secondary electrons give information about wafer topography, defects & critical dimensions.

The SEM may be used for defect review, critical dimension measurements and wafer inspection—with nanometric resolution.

The high accuracy of the SEM makes the SEM an attractive tool for monitoring multiple manufacturing phases of samples such as wafers.

In order to generate and control the e-beam, high voltage signals should be applied to multiple electrodes and parts in the SEM The increased resolution required from: the SEM, makes the SEM very sensitive to noises, disturbances and fluctuation in the high voltage supply signal.

Multiple sources of noise can be found within a SEM (for example—noises from various high voltage modules, cables and connectors) and outside the SEM.

There is a need to provide a system and method is vital to overcome high voltage supply signal stability and precision changes to improve tools performance.

SUMMARY

There may be provided a method and a system for noise reduction of high voltage supply signal to provide a highly stable high voltage supply signal.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

Figure 1:
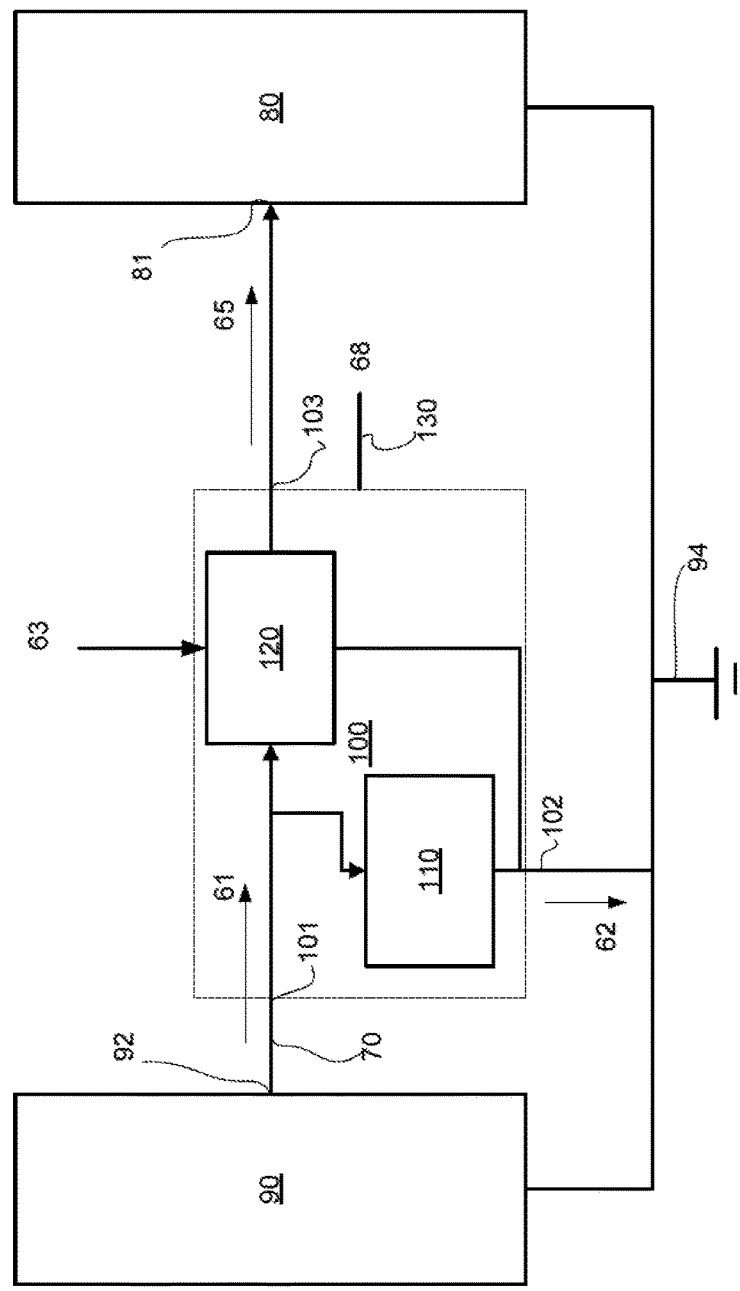
FIG. 1 illustrates an example of a high voltage system, a high voltage supply unit and a high voltage charged particle system.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term "and/or" means additionally or alternatively.

FIG. 1 illustrates high voltage system 100, high voltage supply unit 90 and high voltage charged particle system 80.

High voltage system 100 may include noise reduction unit 110 and bias setting unit 120.

Noise reduction unit 110 and bias setting unit 120 may be configured to receive high voltage supply signal 61 from high voltage supply line 70. High voltage supply signal 61 may be outputted from high voltage supply port 92 of high voltage supply unit 90.

First port 101 of high voltage system 100 receives high voltage supply signal 61.

Noise reduction unit 110 and bias setting units 120 may be coupled to ground 94. Ground 94 may be also shared by high voltage charged particle system 80 and high voltage supply unit 90.

Second port 102 of high voltage system 100 is connected to the ground 94, Second port 102 is also connected to an output port of bias setting unit 120.

Noise reduction unit 110 or a combination of noise reduction unit 110 and bias setting unit 120 may be configured to detect noise in high voltage supply signal 61 and send, though ground 94, noise compensation signal 62 for compensating for the noise in high voltage supply signal 61.

It should be noted that using only bias setting unit 120 can provide noise compensation. Nevertheless—using only bias setting unit 120 provides a less effective noise reduction in comparison to the noise reduction obtained by the combination of noise reduction unit 110 and bias setting unit 120.

FIG. 1 illustrates that the input to noise reduction unit 110 is connected between high voltage supply unit 90 and bias setting unit 120. Nevertheless—the input may be located between bias setting unit 120 and high voltage charged particle system 80.

Bias setting unit 120 may be configured to receive an indication about a requested value of a bias voltage (or receive bias voltage 63), and apply the bias voltage to the high voltage signal (from first port 101) in order to provide biased and noise compensated high voltage signal 65 to high voltage input port 81 of high voltage charged particle system 80. Biased and noise compensated high voltage signal 65 may be outputted via third port 103 of high voltage system 100.

High voltage supply signal 61 may exceeds one hundred volts, fine hundred volts, one thousand volts, five thousand volts—and even more.

Bias setting unit 120 may be configured to apply bias voltage 63 at an accuracy that may be much smaller than high voltage supply signal 61. While the high voltage supply signal may exceed one thousand volts—the bias voltage may be provided at an accuracy (resolution) of a magnitude of millivolts.

High voltage system 100 may include an activation port 130 for receiving ON/OFF signal (activate/deactivate signal) 68—in order to turn on or turn off high voltage system 100. A bypass path may be provided between first port 101 and third port 103 and may be selectively applied when high voltage system 100 is deactivated.

High voltage charged particle system 80 may be configured to generate one or more charged particle beams such as one or more ion beams, one or more electron beams, and the like. High voltage charged particle system 80 may be a scanning electron microscope, an electron imager, a milling system, and the like.

Noise reduction unit 110 may be configured to compensate for the noise over a noise frequency range that spans between less than one Hertz and more than one Mega-Hertz.

Figure 2:
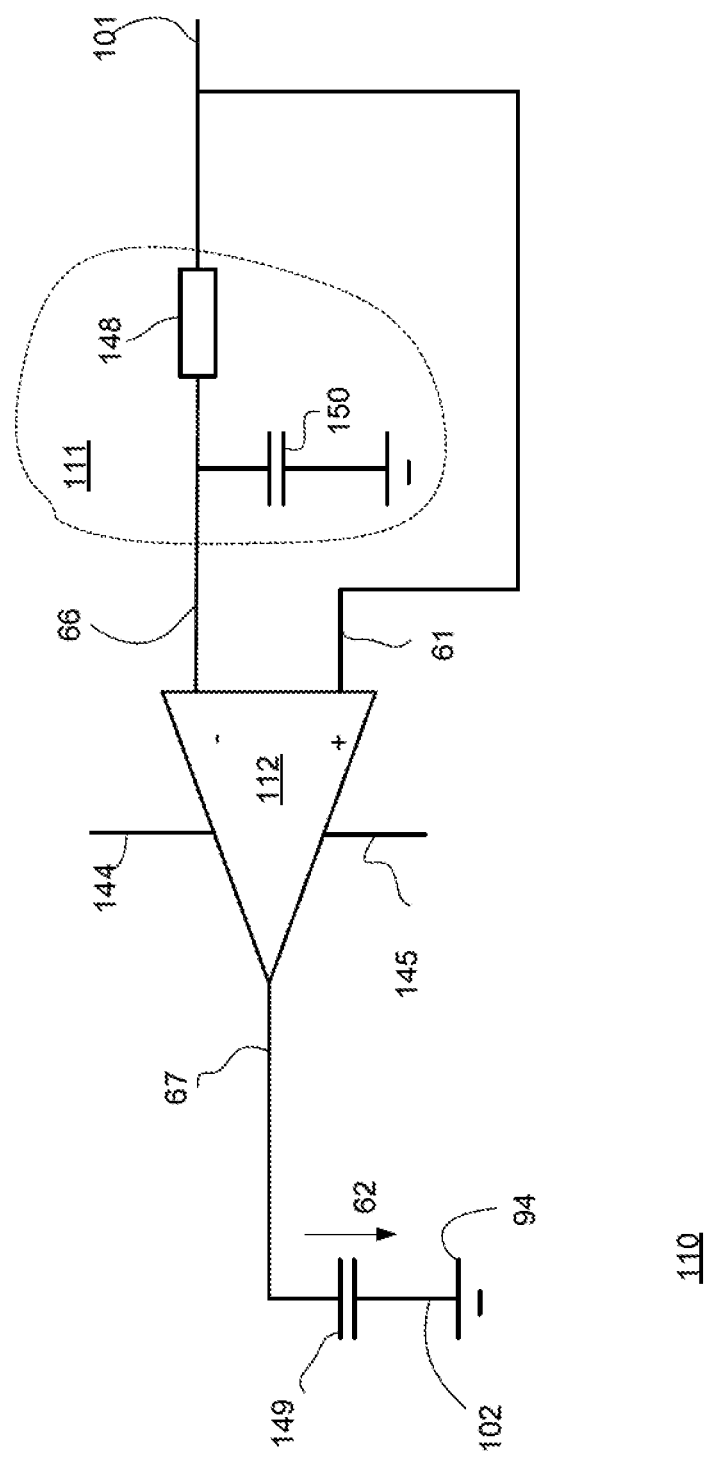
FIG. 2 illustrates an example of a noise reduction unit.

FIG. 2 illustrates an example of noise reduction unit 110.

Noise reduction unit 110 may include amplifier 112 and first low pass filter 111. First low pass filter 111 may be configured to low pass filter high voltage supply signal 61 to provide low pass filtered high voltage supply signal 66, and (b) amplifier 112.

Amplifier 112 includes a positive input (denoted "+") and a negative input (denoted "−"). The positive input is configured to receive high voltage supply signal 61. The negative input is configured to receive low pass filtered high voltage supply signal 66. Amplifier 111 is also fed by supply voltages 144 and 145.

Amplifier 112 is configured to compare high voltage supply signal 61 to low pass filtered high voltage supply signal 66 and provide comparator output signal 67.

Comparator output signal 67 is indicative of an outcome of the comparison. The outcome of the comparison may be an indication of a presence of a the noise in high voltage supply signal 61.

First low pass filter 111 may be formed by eighth resistor 148 and first capacitor 150. Noise reduction unit 110 may include other low pass filters.

Second capacitor 149 is coupled between the output port of amplifier 112 and ground 94 (via second port 102). Amplifier 112 may be coupled to a virtual ground (not shown).

Noise reduction unit 110 may include one or more additional components (not shown) that may be configured to convert comparator output signal 67 to noise compensation signal 62. The conversion may include impedance matching, voltage to current conversion, and the like. For example—the comparator output signal 67 may be a voltage signal that may change its value according to changes in the difference between the high voltage supply signal 61 and the low pass filtered high voltage supply signal 66. The voltage change causes a change in the current that flows through second capacitor 149 and through the ground.

The second capacitor 149 could be replaced by any network of resistors, capacitors, inductors and/or semiconductors that may be configured to increase current flow when higher voltage applied. For example—the second capacitor 149 can be replaced by a resistor, an inductor, a Zener diode, and a capacitor connected in series to each other.

The cutoff frequency of first low pass filter 111 may be of any value—for example it may be lower than ten Hertz, and may even be lower than one Hertz.

Figure 3:
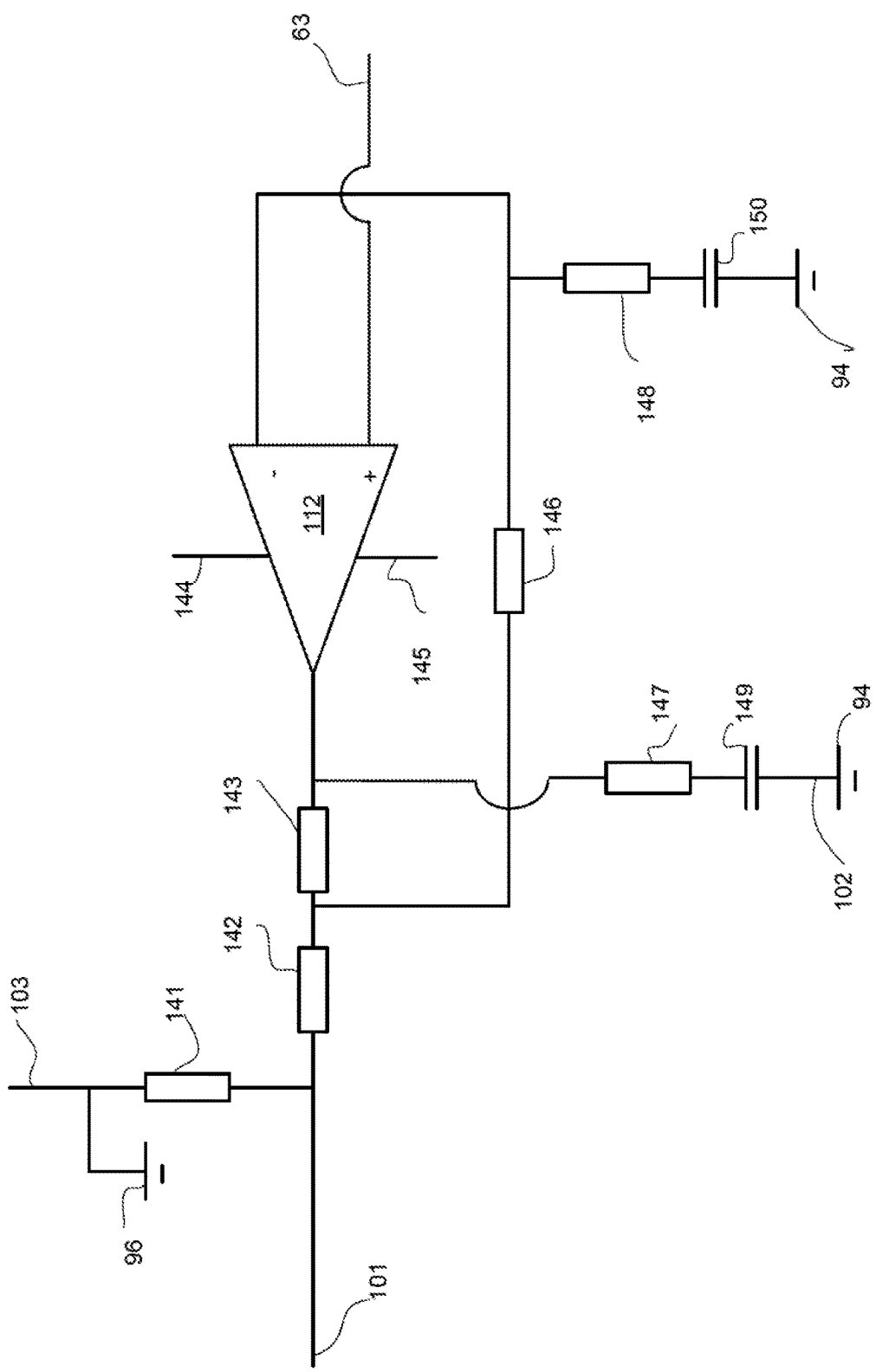
FIG. 3 illustrates an example of a bias setting unit.

FIG. 3 illustrates an example of bias setting unit 120.

Bias setting unit 120 may include amplifier 112, first resistor 141, second resistor 142, third resistor 143, sixth resistor 146, seventh resistor 147, eighth resistor 148, first capacitor 150, and second capacitor 149.

Amplifier 112 includes a positive input (denoted "+") and a negative input (denoted "−"). Bias voltage 63 is provided to the positive input of amplifier 112. Amplifier 111 is also fed by supply voltages 144 and 145.

First resistor 141 is a serial resistance that separate source and load. A first end of first resistor is coupled to first port 101. A second end of first resistor 141 is connected to virtual ground 96 and to third port 103. Second resistor 142 and third resistor 143 form an amplifier offset compensation network.

Sixth resistor 146 and first capacitor 150 form a second low pass filter.

Seventh resistor 147 and eighth resistor 148 can be added to improve high voltage immunity of bias setting unit 120. Second capacitor 149 and seventh resistor 147 are coupled between the output port of amplifier 112 and ground 94.

The bias setting unit 120 may perform noise compensation in substantially the same manner as the bias setting unit thereby causing an electric current flow to pass through second capacitor 149.

The bias setting unit 120 may perform noise compensation by developing a voltage drop on first resistor 141 that is a correction voltage needed to compensate for the noise so the voltage drop on the first resistor 141 should be equal or close to the noise.

The first resistor 141 may be replaced by any network of resistors, inductors, capacitances, and semiconductor elements such as diodes. For example, the first resistor may be replaced by resistors, capacitors and diodes that are connected in parallel to each other.

Figure 4:
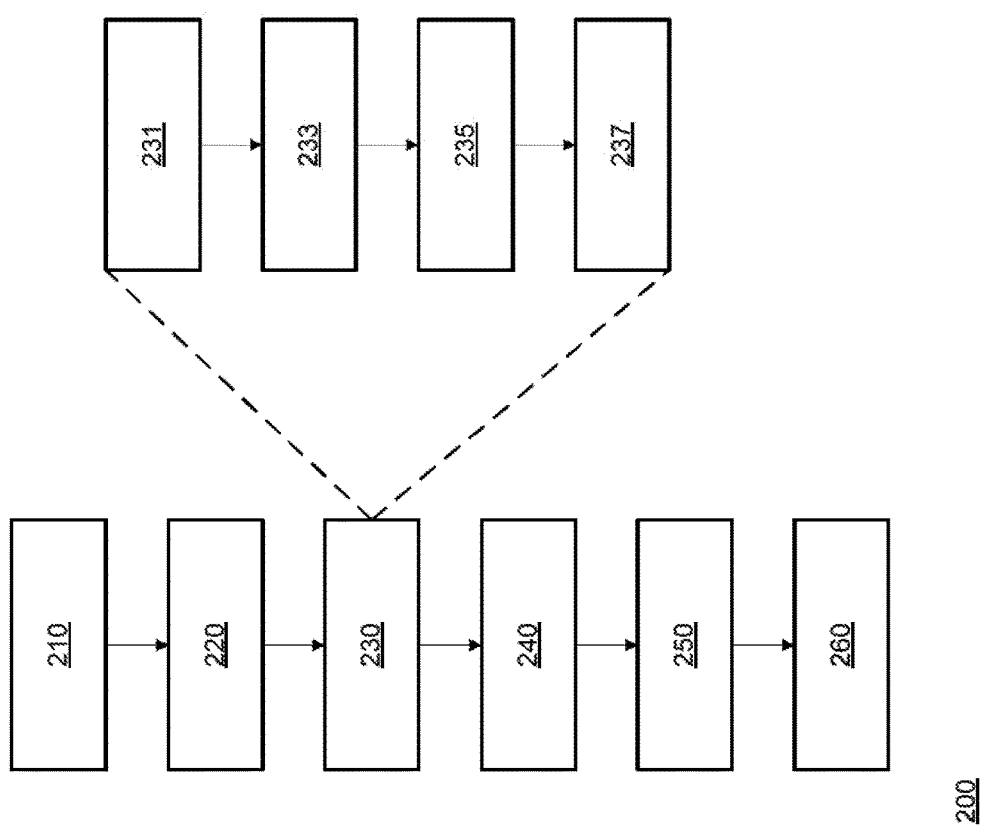
FIG. 4 illustrates an example of a method.

FIG. 4 illustrates method 200 for high voltage noise reduction.

Method 200 may include steps 210, 220, 230, 240, 250 and 260.

Step 210 may include receiving, by a noise reduction unit and a bias setting units, a high voltage supply signal. The high voltage supply signal is received over a high voltage supply line, and from a high voltage supply port of a high voltage supply unit. The noise reduction unit and the bias setting units are coupled to a ground that is also shared by a high voltage charged particle system and the high voltage supply unit.

Step 210 may be followed by step 220 of detecting, by at least the noise reduction unit, noise in the high voltage supply signal.

At least the noise reduction unit means (i) the noise reduction or (ii) the noise reduction and an additional unit such as the bias setting unit.

Step 220 may be followed by step 230 of generating a noise compensation signal for compensating for the noise in the high voltage signal.

Step 230 may be followed by step 240 of sending, though the ground, the noise compensation signal.

Method 200 may also include step 250 of applying the bias voltage to the high voltage signal (following step 240 of compensating for the noise) to provide a biased and noise compensated high voltage signal.

Multiple iterations of steps 210, 220, 230, 240 and 250 may be provided to maintain the high voltage supply signal at a noise compensated value. The repetitions may be executed in a continuous manner or in spaced apart iterations.

Step 250 may be followed by step 260 of providing the biased and noise compensated high voltage signal to a high voltage input port of the high voltage charged particle system.

Step 230 may include a sequence of steps 231, 233 and 235.

Step 231 may include low pass filtering the high voltage supply signal, by a low pass filter, to provide a low pass filtered high voltage supply signal.

Step 233 may include comparing, by a comparator, the high voltage supply signal to the low pass filtered high voltage supply signal.

Step 235 may include providing a comparator output signal that is indicative of an outcome of the comparison, wherein the outcome of the comparison is an indication of the noise in the high voltage supply signal.

Step 230 may also include step 237 of converting, by one or more additional components of the noise reduction unit, the comparator output signal to the noise compensation signal.

The suggested solution was found to provide noise reduction of at least 20 dB over a large ranged of noise frequency (for example between less than a Hertz and above one Mega-Hertz).

While the high voltage supply signal may exceed one thousand volts—the bias voltage may be provided at an accuracy (resolution) of a magnitude of millivolts. This enable accurate adjustment of the electron beams generated by a SEM supplied with noise compensated high voltage supply voltage.

The solution also provide an improved high voltage arc immunity.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

Any combination of any module or unit listed in any of the figures, any part of the specification and/or any claims may be provided. Especially any combination of any claimed feature may be provided.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The foregoing specification, includes specific examples of one or more embodiments. It will, however, be evident that various modifications and changes may be made therein without departing from the broader spirit and scope of the one or more embodiments as set forth in the appended claims.

I claim:

1. A high voltage system, the high voltage system comprises:
    a noise reduction unit; and
    a bias setting unit;
    wherein the noise reduction unit and the bias setting unit are configured to receive a high voltage supply signal, over a high voltage supply line, and from a high voltage supply unit;
    wherein the noise reduction unit and the bias setting units are coupled to a ground that is also shared by a high voltage charged particle system and the high voltage supply unit;

wherein the noise reduction unit is configured to detect noise in the high voltage supply signal and send, through the ground, a noise compensation signal for compensating for the noise to provide a noise compensated high voltage signal; and wherein the bias setting unit is configured to receive an indication about a requested value of a bias voltage, and apply the bias voltage to the noise compensated high voltage signal to provide a biased and noise compensated high voltage signal to the high voltage charged particle system.

2. The high voltage system according to claim 1 wherein the noise reduction unit comprises (a) a low pass filter that is configured to low pass filter the high voltage supply signal to provide a low pass filtered high voltage supply signal, and (b) a comparator that is configured to compare the high voltage supply signal to the low pass filtered high voltage supply signal and provide a comparator output signal that is indicative of the noise in the high voltage supply signal.

3. The high voltage system according to claim 2 wherein a cutoff frequency of the low pass filter is lower than ten Hertz.

4. The high voltage system according to claim 2 wherein a cutoff frequency of the low pass filter is lower one Hertz.

5. The high voltage system according to claim 1 wherein the high voltage supply signal exceeds one hundred volts and wherein the bias setting unit is configured to apply the bias voltage at an accuracy of less than ten millivolts.

6. The high voltage system according to claim 1 comprising an activation port for receiving an activate signal and a deactivate signal.

7. The high voltage system: according to claim 1 wherein the high voltage charged particle system is a scanning electron microscope.

8. The high voltage system according to claim 1 wherein that the noise reduction unit is configured to compensate for the noise over a noise frequency range that spans between less than one Hertz and more than one Mega-Hertz.

9. A method for high voltage noise reduction, the method comprises:

receiving, by a noise reduction unit and a bias setting unit, a high voltage supply signal, over a high voltage supply line, and from a high voltage supply unit; wherein the noise reduction unit and the bias setting unit are coupled to a ground that is also shared by a high voltage charged particle system and the high voltage supply unit;

detecting, by at least the noise reduction unit, noise in the high voltage supply signal;

generating a noise compensation signal for compensating for the noise to provide a noise compensated high voltage signal;

receiving an indication about a requested value of a bias voltage;

sending, though the ground, the noise compensation signal;

applying the bias voltage to the noise compensated high voltage signal to provide a biased and noise compensated high voltage signal; and providing the biased and noise compensated high voltage signal to the high voltage charged particle system.

10. The method according to claim 9 wherein the generating of the noise compensation signal comprises:

low pass filtering the high voltage supply signal, by a low pass filter, to provide a low pass filtered high voltage supply signal;

comparing, by a comparator, the high voltage supply signal to the low pass filtered high voltage supply signal; and providing a comparator output signal that is indicative of the noise in the high voltage supply signal.

11. The method according to claim 10 wherein a cutoff frequency of the low pass filter is lower than ten Hertz.

12. The method according to claim 10 wherein a cutoff frequency of the low pass filter is lower one Hertz.

13. The method according to claim 9 wherein the high voltage supply signal exceeds one hundred volts and wherein the bias setting unit is configured to apply the bias voltage at an accuracy of less than ten millivolts.

14. The method according to claim 9 comprising selectively activating and deactivating the noise reduction unit based on an activate signal and a deactivate signal.

15. The method according to claim 9 wherein the high voltage charged particle system is a scanning electron microscope.

16. The method according to claim 9 comprising compensating for the noise over a noise frequency range that spans between less than one Hertz and more than one Mega-Hertz.

* * * * *